US006465283B1

(12) United States Patent
Chang et al.

(10) Patent No.: US 6,465,283 B1
(45) Date of Patent: Oct. 15, 2002

(54) STRUCTURE AND FABRICATION METHOD USING LATCH-UP IMPLANTATION FOR IMPROVING LATCH-UP IMMUNITY IN CMOS FABRICATION PROCESS

(75) Inventors: Chyh-Yih Chang, Taipei Hsien; Ming-Dou Ker, Hsinchu; Hsin-Chin Jiang, Taipei; Jeng-Jie Peng, Tau-Yun, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 114 days.

(21) Appl. No.: 09/654,810

(22) Filed: Sep. 5, 2000

(30) Foreign Application Priority Data

Feb. 1, 2000 (TW) ...................................... 89101682 A

(51) Int. Cl.[7] .................. H01L 21/332; H01L 21/8238; H01L 29/74; H01L 29/76

(52) U.S. Cl. ....................... 438/135; 438/140; 438/199; 257/133; 257/142; 257/170; 257/372

(58) Field of Search ................................ 257/133, 139, 257/142, 168, 170, 369, 372; 438/133, 135, 140, 199

(56) References Cited

U.S. PATENT DOCUMENTS 4,380,021 A * 4/1983 Matsuyama et al. ........ 257/162
4,603,471 A * 8/1986 Strain ......................... 438/199
5,293,051 A * 3/1994 Mariyama et al. .......... 257/129
5,523,246 A * 6/1996 Yang .......................... 438/220
5,637,900 A * 6/1997 Ker et al. .................. 257/355
5,770,504 A * 6/1998 Brown et al. ............... 438/296
5,821,589 A * 10/1998 Borland ...................... 257/369
5,831,313 A * 11/1998 Han et al. ................... 257/371
5,861,330 A * 1/1999 Baker et al. ................ 438/232
5,879,967 A * 3/1999 Kim ........................... 438/133

OTHER PUBLICATIONS

Borland et al., "Epi Avoidance for CMOS Logic Devices Using MeV Implantation", Proceedings of the 11th International Conference on Ion Implantation Technology, Jun. 16–21, 1996, pp. 21–24.*

* cited by examiner

*Primary Examiner*—Matthew Smith
*Assistant Examiner*—Lex H. Malsawma
(74) *Attorney, Agent, or Firm*—J.C. Patents

(57) ABSTRACT

A structure and fabrication method using latch-up implantation to improve latch-up immunity in CMOS circuit. The impedance of parasitic SCR conducting path is raised by performing an ion-implantation process on a cathode and an anode of a parasitic SCR which may induce latch-up phenomenon. Thus, the parasitic SCR is thus not easily to be conducted with a higher resistance to noise. Therefore, the latch-up immunity can be improved. In addition, the ion implantation process can be performed to achieve the objective of preventing latch-up effect without consuming more area for layout, thus greatly enhances the flexibility in circuit design.

21 Claims, 6 Drawing Sheets

STRUCTURE AND FABRICATION METHOD USING LATCH-UP IMPLANTATION FOR IMPROVING LATCH-UP IMMUNITY IN CMOS FABRICATION PROCESS

CROSS-REFERENCE TO RELATED APPLICATION

This application claims the priority benefit of Taiwan application serial no. 89101682, filed Feb. 1, 2000.

BACKGROUND OF THE INVENTION

1. Field of the Invention

The present invention relates to the method of improving the latch-up effect in complementary metal-oxide semiconductor (CMOS) process. More particular, the present invention relates to a fabrication method and a structure performed ion implantation on the cathode or the anode of parasitic latch-up silicon-controlled rectifiers (SCR). Therefore, the impedance in the parasitic SCR conducting path can be raised to increase the trigger level, so as to prevent the occurrence of latch-up effect induced by noise.

2. Description of the Related Art

In the CMOS circuit design, to avoid the body effect, the bulk of a P-channel MOS (PMOS) is typically connected to the most positive voltage, and the bulk of an N-channel MOS (NMOS) is connected to the most negative voltage. Thus, a parasitic SCR device is formed. The most positive voltage is applied to the anode of the SCR device, while the most negative voltage is applied to the cathode of the SCR device. When the distance between the PMOS and the NMOS is small enough, the parasitic SCR device is easily triggered on to induce the latch-up phenomenon. Under normal operation, this latch-up path is not conducted. However, while noise exists as a trigger, the parasitic SCR device is easily conducted to cause a regeneration which results in a large current flowing through the IC and momentary or permanent loss of IC function.

The latch-up effect has been disclosed in some publication such as the issued US patents as follows:

1. The U.S. Pat. No. 5,879,967, "Methods forming power semiconductor devices having latch-up inhibiting regions" by Tae-Hoon Kim et al. in Mar. 19, 1999.

2. The U.S. Pat. No. 5,861,330, "Method and Structure to reduce latch-up using edge implants" by Faye D. Baker et al. in Jan 19, 1999.

3. The U.S. Pat. No. 5,831,313, "Structure for improving latch-up immunity and interwell isolation in a semiconductor device" by Chung-Chyung Han et al. in Nov. 3, 1998.

4. The U.S. Pat. No. 5,821,589, "Method for CMOS latch-up improvement by mev billi (buried implanted layer for lateral isolation) plus buried layer implantation" by John O Borland et al. in Oct. 13, 1998.

5. The U.S. Pat. No. 5,770,504, "Method for increasing latch-up immunity in CMOS devices" by Jeffery S. Brown et al. in Jun. 23, 1998.

FIG. 1 is a cross-sectional view of a conventional parasitic SCR device parasitic in a CMOS process. The SCR device is equivalent to a two-terminal circuit comprising two bipolar junction transistors (BJT) including the lateral npn BJT 12 and the vertical pnp BJT 14, two resistors including the substrate resistor $R_{sub}$ 16 and the n-well resistor $R_{well}$ 18.

FIG. 2 shows the equivalent circuit schematic diagram of the SCR device. Under certain conditions such as terminal over voltage stress, transient displacement currents of ionizing radiation, lateral currents in the well and substrate can cause sufficient Ohmic drop due to the well resistance $R_{well}$ 18 and the substrate resistance $R_{sub}$ 16, hence forward biasing emitter-base junctions and activating both bipolar devices, the npn BJT 12 and the pnp BJT 14. When the current gain product of the two BJTs is sufficient to cause regeneration, the pnpn SCR can be switched to a low impedance, high current state. This condition is defined as latch-up. To eliminate or reduce latch-up possibility, the holding voltage at the "ON" state of the SCR device has to be maintained at higher voltage then $V_{DD}$, or the current gain product of the npn BJT 12 and the pnp BJT 14 has to be kept at less than 1, or the emitter-base junctions of both BJT have to be kept at non-forward bias situation.

Numerous methods have been proposed to eliminate or reduce latch-up possibility, which comprises:

1. Using an epitaxial wafer.
2. Forming a retrograde well.
3. Forming a shallow trench isolation.
4. Using the silicon on insulator (SOI) technique.
5. Forming guard rings.

FIG. 3 shows a conventional method using epitaxial wafer to prevent the latch-up effect. To decouple the two BJTs shown in FIG. 2, one can dramatically reduce the resistance $R_{well}$ 18 or $R_{sub}$ 16. $R_{well}$ 18 can be reduced by increasing the well doped concentration, but a too heavily doped well can result in the MOSFET performance in the well being affected. Alternatively, the $R_{sub}$ 16 can be reduced by using an expitaxial layer on a heavily doped substrate as shown in FIG. 3. Because the heavily-doped substrate is farther away from the active channel region, this method does not affect the MOSFET performance.

In FIG. 4, a prior art to prevent latch-up by forming guard rings is shown. The path 30 indicates the latch-up current path. The PMOS and NMOS are guarded by the guard rings 32, 34, respectively. Because the latch-up current path has been broken by the guard ring 32 and 34, the noise current injected into the well and substrate will be absorbed by the guard rings 32 and 34, respectively. Thus, the latch-up immunity of the CMOS device structure can be dramatically increased.

SUMMARY OF THE INVENTION

The present invention is directed to provide a structure using latch-up implantation to improve the latch-up immunity in CMOS IC's. The structure comprises a first conductive type substrate, a second conductive type well, a first and a second transistors, a lightly doped first conductive type region, a lightly doped second conductive type region, a heavily doped first conductive type region and a heavily doped second conductive type region. The first transistor comprising a first source region, a first drain region and a first gate is formed on the second conductive type well. The first source region and the first drain region comprise heavily dope of first conductive type. The second transistor comprising a second source region, a second drain region and a second gate is formed on the first conductive type substrate. The second source region and the second drain region comprise heavily dope of second conductive type. The lightly doped first conductive type region is located at a junction between the bottom of the first source region and the second conductive type well region, while the lightly doped second conductive type region is located between the bottom of the second source region and the first conductive type substrate. The heavily doped first conductive type region located in the first conductive type substrate is near the second source region, and the heavily doped second conductive type region located in the second conductive type well is near the first source region.

The invention further provides a method using latch-up implantation for improving the latch-up immunity in the CMOS process. A second conductive type well is first formed in a first conductive type substrate. A first and second polysilicon gates are formed above the second conductive type well and the first conductive type substrate, respectively. A first conductive type ion implantation is performed to form the heavily doped first conductive type source region and drain region in the second conductive type well, and a heavily doped first conductive type region in the first conductive type substrate. A second conductive type ion implantation is performed to form the heavily doped second conductive type source region and drain region in the first conductive type substrate, and the heavily doped second conductive type region in the second conductive type well. Following, a latch-up implantation is used to form a lightly doped first conductive type region which locates between the bottom of the heavily doped first conductive type source region and the bottom of the second conductive type well. Then the latch-up implantation is further used to form a lightly doped second conductive type region which locates between the bottom of the heavily doped second source region and the bottom of the first conductive type substrate. The orders of performing the first conductive type ion implantation and the second conductive type implantation can be interchanged. In addition, the sequence for performing the first and second conductive type latch-up implantation can also be reversed.

In the structure and the fabrication method mentioned above, using ion implantation to form lightly doped regions at the cathode and the anode of a parasitic SCR device where the latch-up effect is likely to occur, the impedance of the SCR conducting path is increased. Therefore, the immunity to the noise which can induce latch-up phenomenon is increased. The latch-up effect is thus prevented from occurring. Furthermore, the ion implantation process does not require additional layout area of IC's, therefore, the flexibility of the circuit design is greatly enhanced.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

As mentioned above, in a typical circuit design for a CMOS IC, to prevent the body effect, the bulk of the PMOS is coupled to the most positive voltage source, and the bulk of the NMOS is coupled to the most negative voltage source. In this manner, a latch-up current path is easily induced. Under a normal operation condition, this latch-up current path is not conducted. However, if a noise is occurred to trigger the latch-up current path on, the parasitic SCR device is conducted to induce the latch-up effect, and thus, the IC is blown.

To effectively solve the problems occurred in the prior art, a method to increase the impedance of the SCR conducting path is provided. The latch-up immunity for the CMOS is thus enhanced. In this invention, an ion implantation which lightly doping is performed at a cathode or anode of the parasitic SCR device that the latch-up current is likely to occur. The impedance of the SCR conducting path is thus increased. This method is referred as latch-up implantation. The parasitic SCR device thus has a higher resistance against the noise and is not easily to be conducted thereby.

Using the latch-up implantation to increase the impedance of the SCR conducting path, so as to prevent latch-up effect does not require any additional silicon area, thus greatly increase the flexibility of circuit design.

Figure 1:
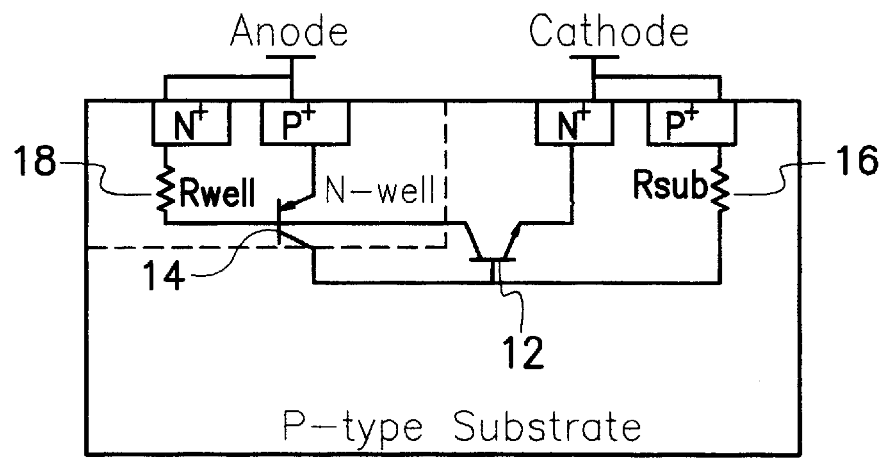
FIG. 1 is a cross sectional view of a conventional SCR device in a CMOS IC.
Figure 2:
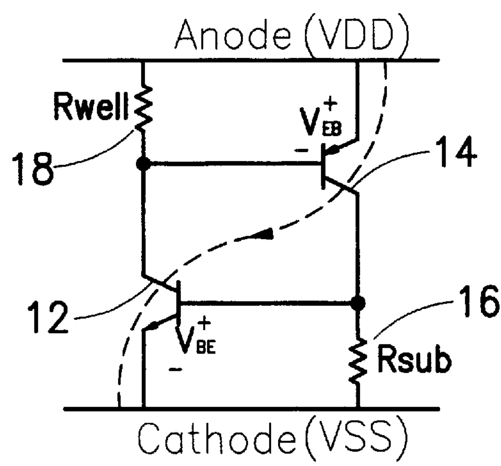
FIG. 2 shows the equivalent circuit of the conventional SCR device as shown in FIG. 1.
Figure 3:
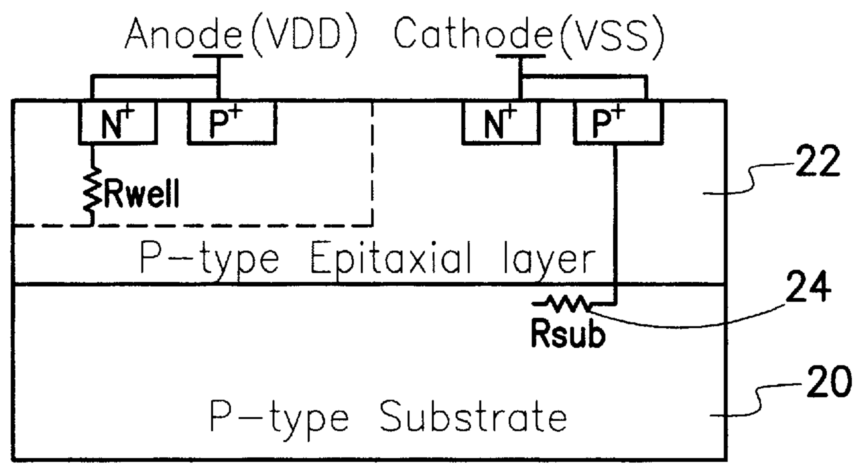
FIG. 3 shows a method using epitaxial wafer to prevent latch-up effect.
Figure 4:
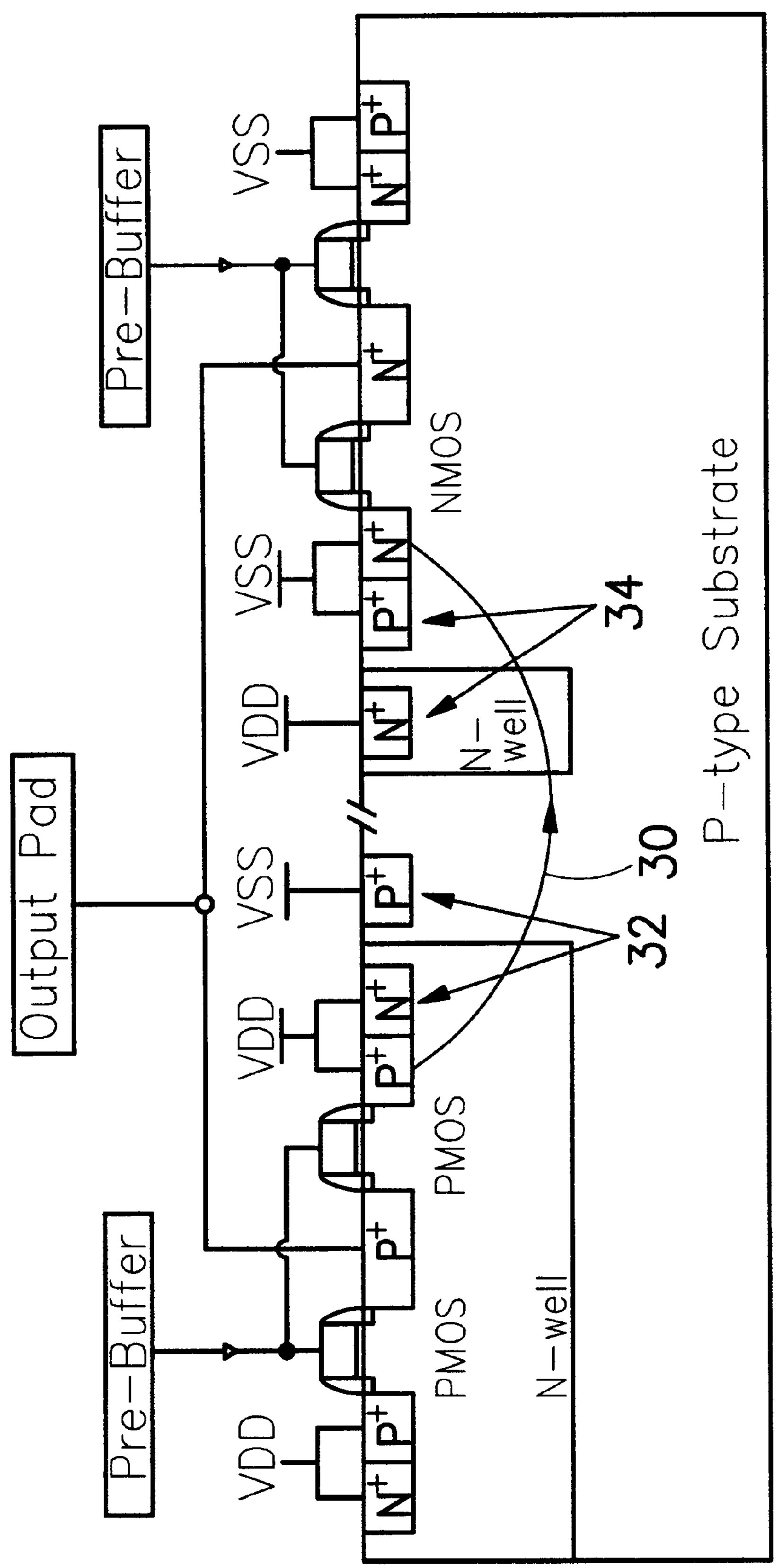
FIG. 4 shows a method of adding guard rings to prevent latch-up effect.
Figure 5:
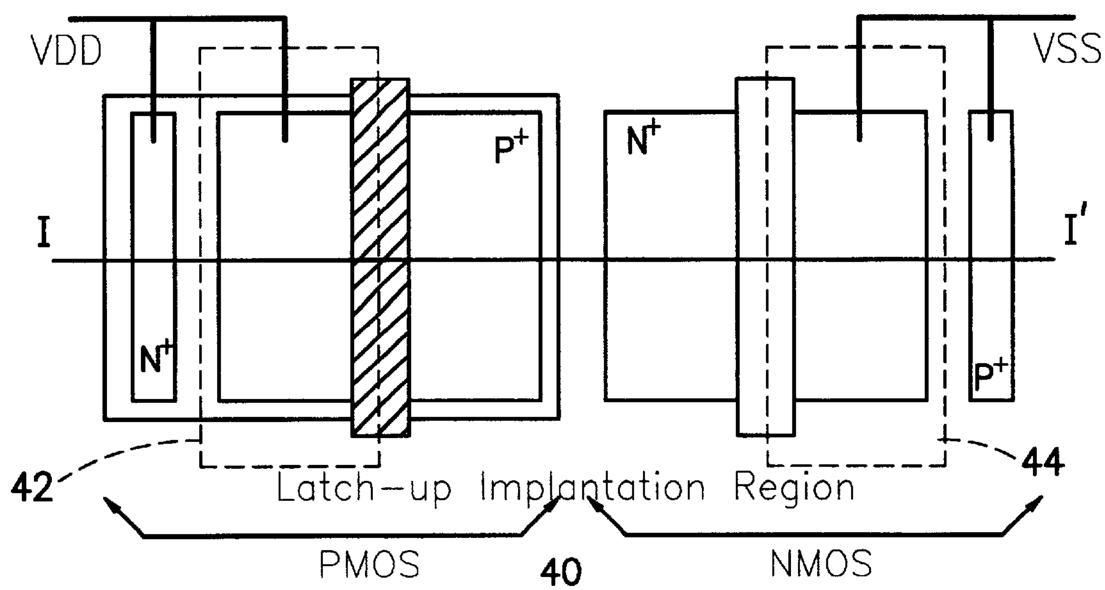
FIG. 5 shows the layout view of the invention.

FIG. 5 shows a layout pattern of the invention. Different from the conventional CMOS device layout pattern, the mask patterns for latch-up implantation are used. The mask pattern 40 for latch-up implantation can be used for PMOS or NMOS. In FIG. 5, the reference numeral 42 indicates the latch-up implanting region for PMOS, while the reference numeral 44 indicates the latch-up implanting region for NMOS.

FIG. 6A to FIG. 6E shows a brief flowchart of a conventional CMOS fabrication process with an additional step of the latch-up implantation.

Figure 6A:
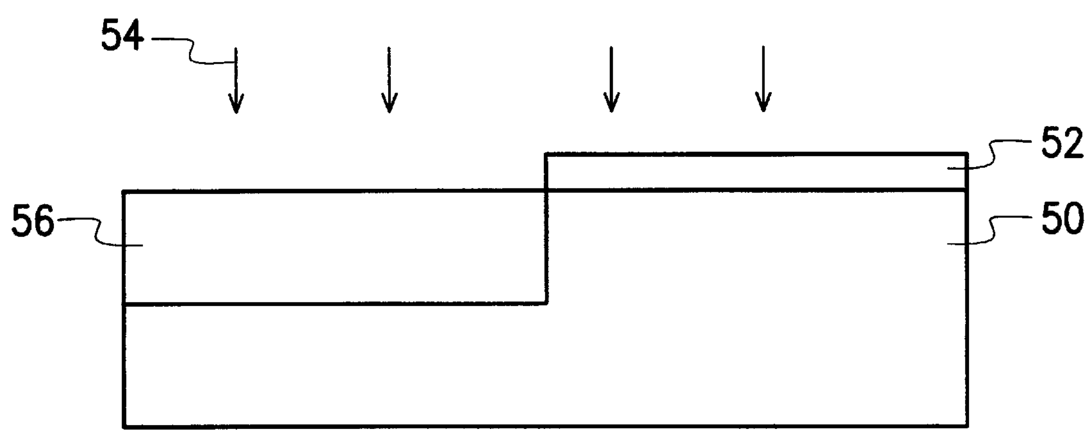
FIG. 6A to FIG. 6E show a fabrication process of the layout as shown in FIG. 5.

In FIG. 6A, a substrate 50, for example, a P-type substrate, is provided. A photoresist layer 52 is formed to cover a portion of the substrate 50. The substrate 50 exposed by the photoresist layer 52 is implanted with N type ions to form an N-well 56.

Figure 6B:
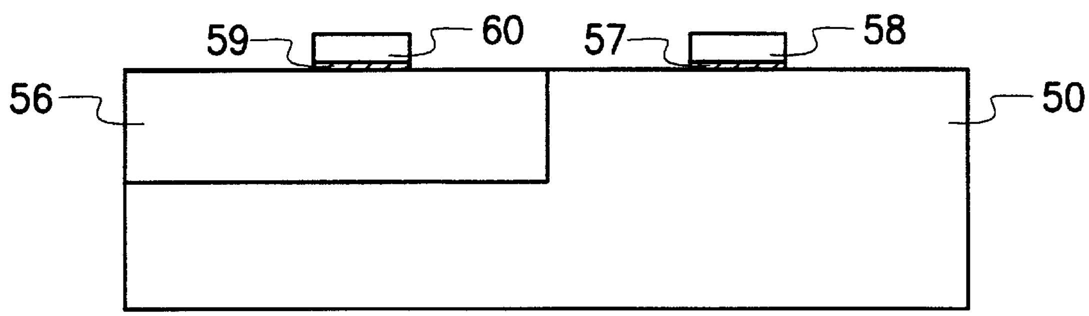

In FIG. 6B, the photoresist layer 52 is removed. An oxide layer and a polysilicon layer are sequentially formed on the substrate 50 including the N-well 56. The oxide layer and the polysilicon layer are then patterned to respectively form a gate oxide 57 and a gate 58 on the P-type substrate 50, and a gate oxide 59 and a gate 60 on the N-well 56.

Figure 6C:
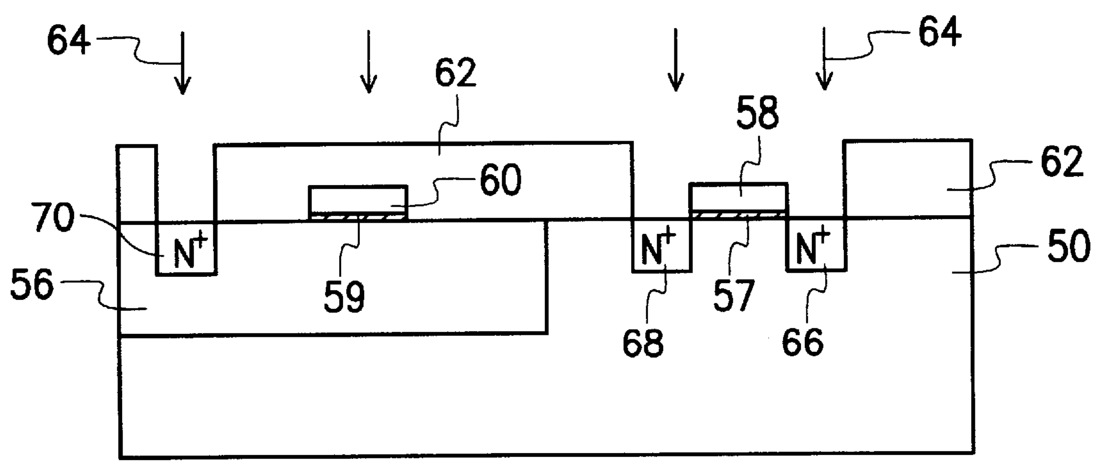

In FIG. 6C, a photoresist layer 62 is formed on the substrate 50 including the N-well 56. The photoresist layer 62 covers a portion of the N-well 56, the gate 60 and a portion of the P-type substrate 50, while exposing the second gate 58 and a region near the first gate 60. An NMOS source/drain implantation 64 is performed. That is, using the photoresist layer 62 as a mask, a heavily doped source region 66 and a heavily doped drain region 68 are formed aside of the gate 58, and a heavily doped N-type region 70 ($N^+$-region) is formed in the N-well 56. Thus far, an NMOS including the source region 66, the drain region 68 and the gate 58 is formed. The photoresist layer 62 is then removed.

Figure 6D:
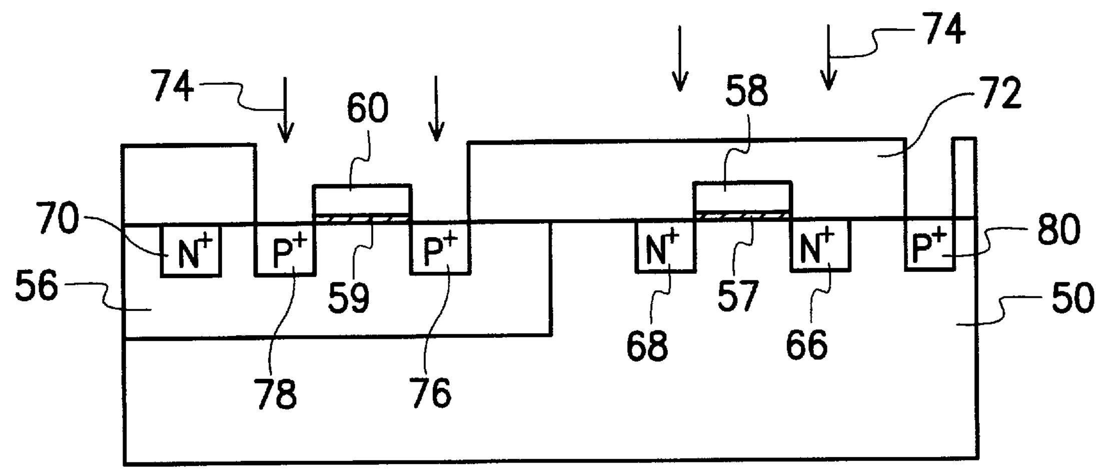

In FIG. 6D, another photoresist layer 72 is formed on the substrate 50 including the N-well 56. The photoresist layer 72 covers the whole P-type substrate 50 including the NMOS, except a portion near and with a distance to the source region 66. The photoresist layer 72 further covers a portion of the N-well 56, and exposes the gate 60 and a region next to the gate 60. A PMOS source/drain implantation is performed. That is, using the photoresist layer 72 as a mask, p-type ions 74 are implanted into the P-type substrate 50 and the N-well 56 heavily to form a source region 78 and a drain region 76 around the gate 60 in the N-well 56, and a heavily dope P-type region 80 ($P^+$-region) in the P-type substrate 50. The photoresist layer 72 is then removed.

After the PMOS and NMOS ion implantation steps in FIG. 6C and 6D, an NMOS is formed in the P-type substrate 50, and a PMOS including the source region 78, the drain region 76 and the gate 60 is formed in the N-well 56. In addition, an $N^-$-region 70 is formed near and with a distance to the source region 78 in the N-well 56, while a $P^+$-region 80 is formed near and with a distance to the source region 66 in the P-type substrate 50.

Figure 6E:
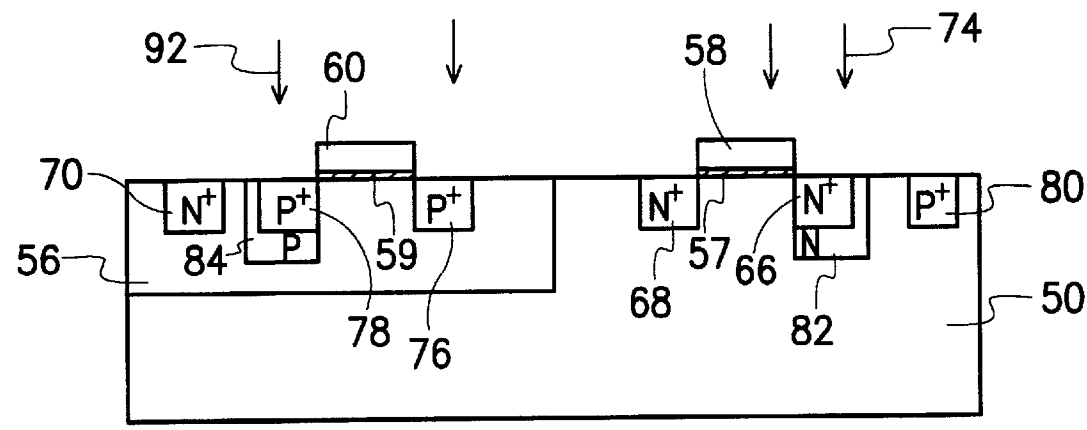

In FIG. 6E, lightly doped regions including P-region 84 and N-region 82 are formed in the N-well 56 and the substrate 50, respectively. The lightly doped P-region 84 is located at the same place with the source region 78 and deeper than source region 78 but shallower than the N-well 56. The lightly doped N-region 82 is located at the same place with the source region 66 and deeper than the source region 66. The following two process sequences of forming the lightly doped P-region 84 and the lightly doped N-region 82 can be interchanged. First, a photoresist layer is formed on the P-type substrate and the N-well 56 and exposing a portion located at the same place with the source region 78 but larger than the source region 78. Then, the first type same with the $p^+$ region latch-up implantation is performed to form the lightly doped P-region and the photoresist layer is removed. Second, another photoresist layer is formed on the P-type substrate 50 and the N-well 56, and exposing a portion located at the same place with the source region 66 but larger than the source region 66. Then, the second type same with $n^+$ region latch-up implantation is performed to form the lightly doped N-region 82, and the photoresist layer is then removed.

It is appreciated that a P-well can also be formed in an N-type substrate with a structure the same as shown in FIGS. 6A to 6E, while the conductive types of N and P of the above structure are interchanged. Also, the process shown in FIG. 6E could be done before performing the process shown in FIGS. 6C and 6D.

Figure 7A:
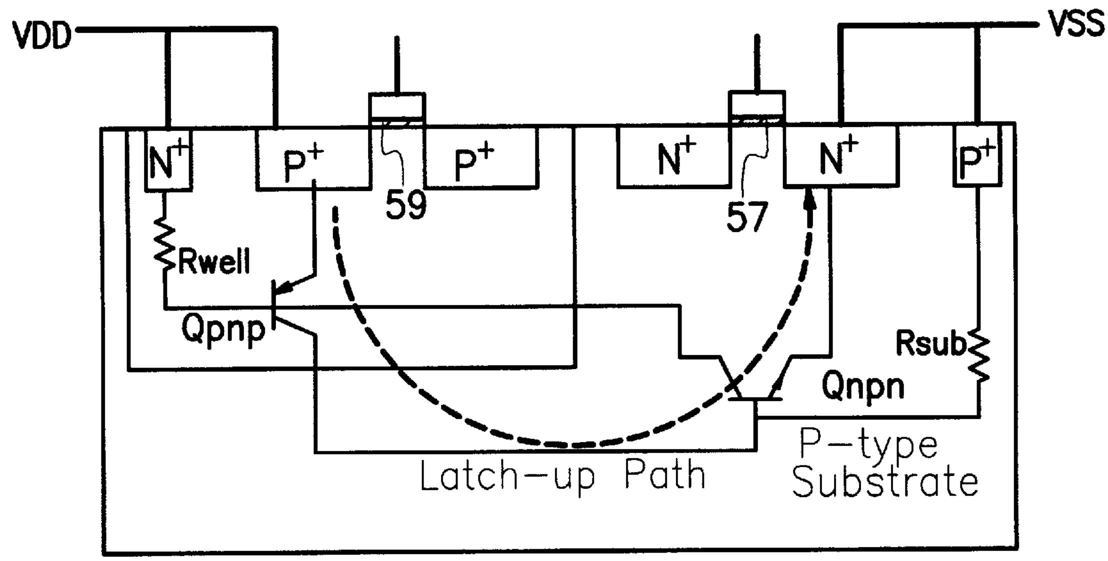
FIG. 7A is a cross sectional view of a CMOS device without using the latch-up implantation.

FIG. 7A shows a path that latch-up phenomenon may happen in CMOS circuits. The latch-up path is illustrated as a dash line in FIG. 7A. The turning on the parasitic BJTs $Q_{pnp}$ and $Q_{npn}$ is the main cause of the latch-up phenomenon as mentioned. Comparing FIG. 7A with FIG. 7B, two lightly doped regions 84 and 82 are the only difference. These two lightly doped regions are latch-up implantation regions. Adding the latch-up implantation regions can increase the intrinsic resistance in the emitter of the parasitic $Q_{pnp}$ and $Q_{npn}$ and thus the bias of emitter-base junction can be reduced.

Figure 7B:
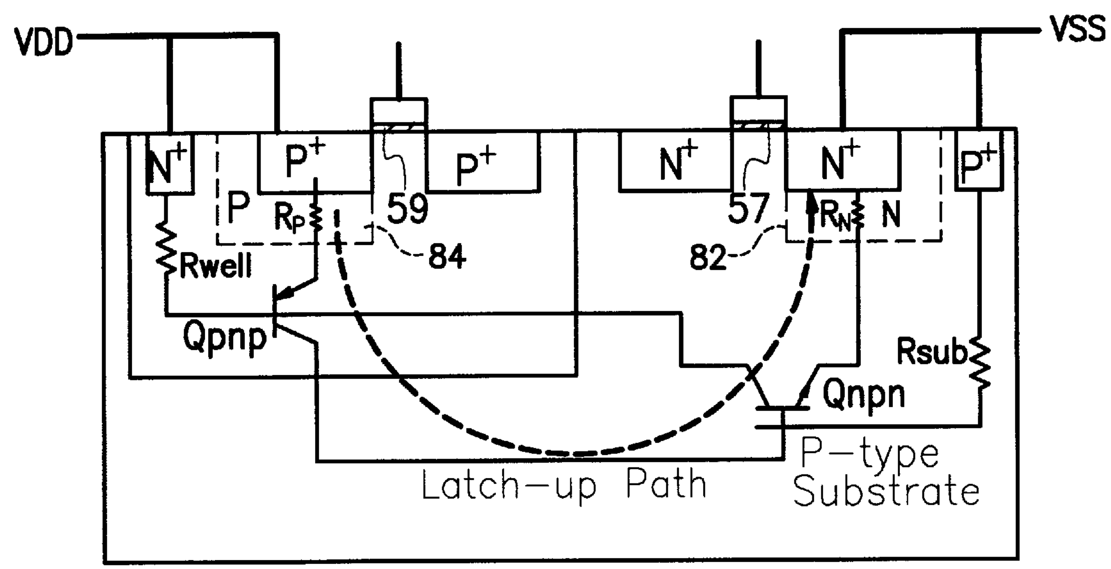
FIG. 7B is a cross sectional view of a CMOS device using latch-up implantation.

As shown in FIG. 7B, the formation of the latch-up implanting regions 82 and 84 equivalently adds a resistor $R_P$ in the emitter of the $Q_{pnp}$ and a resistor $R_N$ in the emitter of the $Q_{npn}$. The increased impedance thus raise the threshold for the occurrence of the latch-up. In addition, there is no alteration for the channels of the NMOS and the PMOS, therefore, the original I–V characteristics thereof is not altered. That is, both the transistors PMOS and NMOS can work normally without being affected by the latch-up implantation.

Figures 8, 9, 10A, 10B:
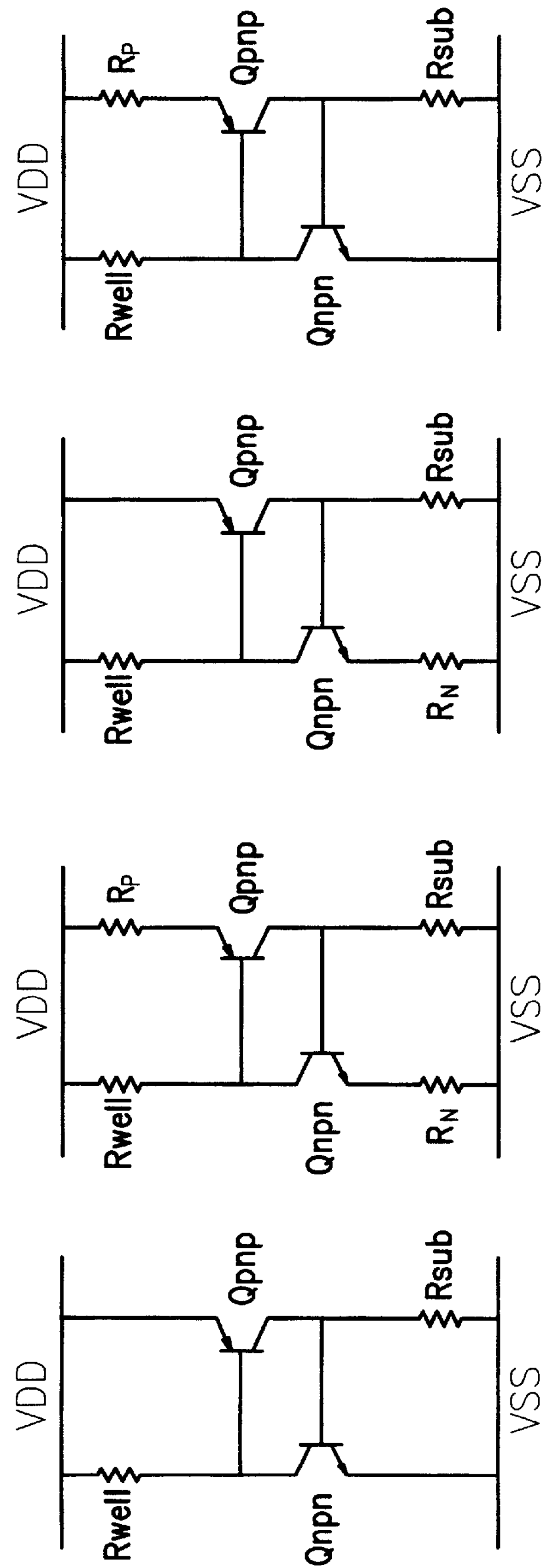
FIG. 8 schematically illustrates the parasitic circuit of the CMOS device as shown in FIG. 7A.
FIG. 9 schematically illustrates the parasitic circuit of the CMOS device as shown in FIG. 7B.
FIG. 10A shows another embodiment of the parasitic circuit according to the invention.
FIG. 10B shows also another embodiment of the parasitic circuit according to the invention.

FIG. 8 and FIG. 9 show the equivalent parasitic circuit diagrams of the CMOS device as shown in FIGS. 7A and 7B, respectively.

The additional latch-up implantation produces the additional resistors $R_P$ and $R_N$. With adding $R_N$ in the emitter of the BJT $Q_{npn}$, the noise level which can trigger on the BJT $Q_{npn}$ is arose. Also, with adding $R_P$ in the emitter of the BJT $Q_{pnp}$, the noise level which can trigger on the BJT $Q_{pnp}$ is arose. Thus, the noise level which can trigger on the whole SRC device is arose, and the immunity of latch-up effect of the CMOS circuit is improved.

In addition to the resistors $R_P$ and $R_N$, the structure may be formed to include either one of the resistors $R_P$ or $R_N$ (as shown in FIGS. 10A and 10B, respectively). That is, referring to the explanation of FIG. 6E, the two process steps of lightly doped regions 84 and 82 may be performed only one of them. In FIG. 10A, the latch-up implanting of lightly doped regions 82 is the only one latch-up implantation process step performed. In FIG. 10B, latch-up implanting of the lightly doped region 84 is the only one latch-up implantation process step performed. Whether one or two latch-up implanting regions are formed depends on specific requirements.

In the conventional method such as increasing the distance between the anode and the cathode of the parasitic SCR, or forming guard rings between the anode and cathode inevitably increase the chip area for layout. Using the latch-up implantation as mentioned above to increase the resistance against the latch-up effect does not consequently use additional chip area, therefore, the flexibility for circuit design is greatly enhanced.

For application, the invention can be applied to digital CMOS circuit design, analog CMOS circuit design, and power device that have a high demand in latch-up prevention.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A structure using latch-up implantation to improve latch-up immunity in CMOS fabrication process, the structure comprising:

a substrate, having a first conductive type;

a well, formed in the substrate and having a second conductive type;

a first MOS transistor formed in the second conductive type well, having a first source and a first drain regions with a first conductive type and a gate;

a second MOS transistor formed in the first conductive type substrate, having a second source and a second drain regions with a second conductive type and a gate;

a first lightly doped region surrounding a bottom and edges of the first source region in the well, the edges of the first source region excluding the edge at a near side of the first drain region, and the first lightly doped region having a first conductive type;

a second lightly doped region surrounding a bottom and edges of the second source region in the substrate, the edges of the second source region excluding the edge at a near side of the second drain region, and the second lightly doped region having a second conductive type;

a first heavily doped region with a second conductive type in the second conductive type well, the first heavily doped region being near and with a distance to the first lightly doped region; and a second heavily doped region with a first conductive type in the first conductive type substrate, the second heavily doped region being near and with a distance to the second lightly doped region.

2. The structure according to claim 1, wherein the first conductive type includes P-type and the second conductive type includes N-type.

3. The structure according to claim 1, wherein the first conductive type includes N-type and the second conductive type includes P-type.

4. A structure using latch-up implantation to improve latch-up immunity in CMOS fabrication process, the structure comprising:

a substrate, having a first conductive type;

a well, formed in the substrate and having a second conductive type;

a first MOS transistor formed in the second conductive type well, having a first source and a first drain regions with a first conductive type and a gate;

a second MOS transistor formed in the first conductive type substrate, having a second source and a second drain regions with a second conductive type and a gate;

a first lightly doped region surrounding a bottom and edges of the first source region in the well, the edges of the first source region excluding the edge at a near side of the first drain region, and the first lightly doped region having a first conductive type;

a first heavily doped region with a second conductive type in the second conductive type well, the first heavily doped region being near and with a distance to the first lightly doped region; and a second heavily doped region with a first conductive type in the first conductive type substrate, the second heavily doped region being near and with a distance to a second lightly doped region, wherein the second lightly doped region is located in the first conductive type substrate.

5. The structure according to claim 4, wherein the first conductive type includes P-type and the second conductive type includes N-type.

6. The structure according to claim 4, wherein the first conductive type includes N-type and the second conductive type includes P-type.

7. A structure using latch-up implantation to improve latch-up immunity in CMOS fabrication process, the structure comprising:

a substrate, having a first conductive type;

a well, formed in the substrate and having a second conductive type;

a first MOS transistor formed in the second conductive type well, having a first source and a first drain regions with a first conductive type and a gate;

a second MOS transistor formed in the first conductive type substrate, having a second source and a second drain regions with a second conductive type and a gate;

a first lightly doped region surrounding a bottom and edges of the second source region in the substrate, the edges of the second source region excluding the edge at a near side of the second drain region, and the first lightly doped region having a second conductive type;

a first heavily doped region with a second conductive type in the second conductive type well, the first heavily doped region being near and with a distance to the first lightly doped region; and a second heavily doped region with a first conductive type in the first conductive type substrate, the second heavily doped region being near and with a distance to a second lightly doped region, wherein the second lightly doped region is located in the first conductive type substrate.

8. The structure according to claim 7, wherein the first conductive type includes P-type and the second conductive type includes N-type.

9. The structure according to claim 7, wherein the first conductive type includes N-type and the second conductive type includes P-type.

10. A method using latch-up implantation to improve latch-up immunity in CMOS fabrication process, the method comprising:

providing a first conductive type substrate comprising a second conductive type well thereon;

forming a first MOS in the second conductive type well and a first heavily doped region with a first conductive type in the first conductive type substrate;

forming a second MOS in the first conductive type substrate and a second heavily doped region with a second conductive type in the second conductive type well;

forming a first lightly doped region with a first conductive type surrounding a bottom and edges of a source region of the first MOS in the well, wherein the edges are those edges except the edge being at near to the drain region of the first MOS; and forming a second lightly doped region with a second conductive type surrounding a bottom and edges of a source region of the second MOS in the substrate, wherein the edges are those edges except the edge being at near to the drain region of the second MOS.

11. The method of claim 10, wherein the first and the second lightly doped regions are formed out of the channel regions of the first and the second MOS's, respectively.

12. The method of claim 10, wherein the step of forming the first MOS includes forming a PMOS, the first conductive type includes P-type, the step of forming the second MOS includes forming a NMOS, and the second conductive type includes N-type.

13. The method of claim 10, wherein the step of forming the first MOS includes forming a NMOS, the first conductive type includes N-type, the step of forming the second MOS includes forming a PMOS, and the second conductive type includes P-type.

14. A method using latch-up implantation to improve latch-up immunity in CMOS fabrication process, the method comprising:

providing a first conductive type substrate comprising a second conductive type well thereon;

forming a first MOS in the second conductive type well and a first heavily doped region with a first conductive type in the first conductive type substrate;

forming a second MOS in the first conductive type substrate and a second heavily doped region with a second conductive type in the second conductive type well;

forming a first lightly doped region with a first conductive type surrounding a bottom and edges of a source region of the first MOS in the well, wherein the edges are those edges except the edge being at near to the drain region of the first MOS.

15. The method of claim 14, wherein the first lightly doped region is formed out of the channel regions of the first MOS.

16. The method of claim 14, wherein the step of forming the first MOS includes forming a PMOS, the first conductive type includes P-type, the step of forming the second MOS includes forming a NMOS, and the second conductive type includes N-type.

17. The method of claim 14, wherein the step of forming the first MOS includes forming a NMOS, the first conductive type includes N-type, the step of forming the second MOS includes forming a PMOS, and the second conductive type includes P-type.

18. A method using latch-up implantation to improve latch-up immunity in CMOS fabrication process, the method comprising:

providing a first conductive type substrate comprising a second conductive type well thereon;

forming a first MOS in the second conductive type well and a first heavily doped region with a first conductive type in the first conductive type substrate;

forming a second MOS in the first conductive type substrate and a second heavily doped region with a second conductive type in the second conductive type well;

forming a first lightly doped region with a second conductive type surrounding a bottom and edges of a source region of the second MOS in the substrate, wherein the edges are those edges except the edge being at near to the drain region of the second MOS.

19. The method of claim 18, wherein the first lightly doped region is formed out of the channel regions of the second MOS.

20. The method of claim 18, wherein the step of forming the first MOS includes forming a PMOS, the first conductive type includes P-type, the step of forming the second MOS includes forming a NMOS, and the second conductive type includes N-type.

21. The method of claim 18, wherein the step of forming the first MOS includes forming a NMOS, the first conductive type includes N-type, the step of forming the second MOS includes forming a PMOS, and the second conductive type includes P-type.

* * * * *